US007397325B2

(12) United States Patent
Yu et al.

(10) Patent No.: US 7,397,325 B2
(45) Date of Patent: Jul. 8, 2008

(54) ENHANCED MICROWAVE MULTIPLEXING NETWORK

(75) Inventors: Ming Yu, Waterloo (CA); Ying Wang, Waterloo (CA)

(73) Assignee: COM DEV International Ltd., Cambridge (CA)

(*) Notice: Subject to any disclaimer, the term of this patent is extended or adjusted under 35 U.S.C. 154(b) by 213 days.

(21) Appl. No.: 11/350,806

(22) Filed: Feb. 10, 2006

(65) Prior Publication Data

US 2007/0188263 A1 Aug. 16, 2007

(51) Int. Cl.
*H01P 5/12* (2006.01)
*H03H 7/46* (2006.01)

(52) U.S. Cl. ...................... 333/135; 333/122; 333/134; 333/137

(58) Field of Classification Search ......... 333/132–135, 333/137, 122
See application file for complete search history.

(56) References Cited

U.S. PATENT DOCUMENTS 2,999,988 A * 9/1961 Marie ......................... 333/1.1
4,029,902 A 6/1977 Bell, Jr. et al.
4,258,435 A 3/1981 Levy et al.
4,614,920 A 9/1986 Tong
4,777,459 A 10/1988 Hudspeth
4,780,693 A * 10/1988 Elliott et al. ................ 333/135
5,233,609 A 8/1993 Hunton
5,235,297 A * 8/1993 Tawil ......................... 333/110
5,254,963 A * 10/1993 Bonetti et al. ............... 333/208
5,274,344 A * 12/1993 Langer et al. ............... 333/135
5,428,322 A 6/1995 Hendrick et al.
5,930,266 A * 7/1999 Ramsey et al. .............. 370/480
6,191,664 B1 2/2001 Fiedziuszko et al.
6,201,949 B1 * 3/2001 Kich et al. ................. 455/12.1
6,472,951 B1 10/2002 Fiedziuszko et al.
6,617,944 B2 * 9/2003 Latouche et al. ............ 333/212
6,806,791 B1 10/2004 Wang et al.
6,847,270 B2 1/2005 Yoneda et al.

OTHER PUBLICATIONS

Neubauer, V. et al., "A Novel Low Loss Microwave Multiplexer Design Based on Directional Filters", IEEE, 2002.

(Continued)

*Primary Examiner*—Benny Lee
*Assistant Examiner*—Kimberly E Glenn
(74) *Attorney, Agent, or Firm*—Bereskin & Parr; Isis E. Caulder

(57) ABSTRACT

A method for configuring a microwave multiplexing network having a first channel filter and a second channel filter and an interconnect in order to improve channel performance. The top ends of the first and second channel filters are coupled to the closer of the top and bottom surfaces of the interconnect according to interconnect spacing values and filter to interconnect values. Interconnect values and filter to interconnect values are determined by selecting interconnect spacing values and filter to interconnect values to ensure that a pole is formed causing an additional real reflection zero to be brought into the passband of the microwave multiplexing network thereby increasing the filter order by one. Then interconnect spacing values and filter to interconnect values as well as the internal filter dimensions are selected to ensure that the return loss of the microwave multiplexing network is less than a predetermined return loss level.

8 Claims, 9 Drawing Sheets

OTHER PUBLICATIONS

Kunes, M., "Microwave Multiplexers for Space Applications", Electronics & Communication Engineering Journal, Feb. 1998.

Guglielmi, M., "Simple CAD Procedure for Microwave Filters and Multiplexers", IEEE Transactions on Microwave Theory and Techniques, vol. 42, No. 7, Jul. 1994.

Rosenberg, U. et al., "Filter Design Using In-Line Triple-Mode Cavities and Novel Iris Couplings", IEEE Transactions on Microwave Theory and Techniques, vol. 37, No. 12, 1989.

Rhodes, J.D. et al., "A Generalized Multiplexer Theory", IEEE Transactions and Microwave Theory and Techniques, vol. MTT-27, No. 2, Feb. 1979.

Rhodes, J.D. et al., "Design of General Manifold Multiplexers", IEEE Transactions and Microwave Theory and Techniques, vol. MTT-27, No. 2, Feb. 1979.

Tang, W. et al., "A True Elliptic-Function Filter Using Triple-Mode Degenerate Cavities", IEEE Transactions on Microwave Theory and Techniques, vol. MTT-32, No. 11, Nov. 1984.

Uher, J. et al., "Waveguide Components for Antenna Feed Systems Theory and CAD", Chapter 3.5.3, pp. 264 to 278, Artech House, Boston-London, 1993.

* cited by examiner

ENHANCED MICROWAVE MULTIPLEXING NETWORK

FIELD

The embodiments described herein relate to microwave multiplexing networks and more particularly to a method for designing microwave multiplexing networks comprising a plurality of filters connected to an interconnect.

BACKGROUND

A microwave multiplexing network is used to combine or separate microwave frequency bands (i.e. those that exist in the range of 100 MHz to 100 GHz) and typically consists of a plurality of channel filters operatively coupled to an interconnect such as a waveguide manifold. Usually, the channel filters are sequentially arranged along the waveguide manifold according to center frequencies with the highest frequency channel or with the lowest frequency channel positioned adjacent to the shorting plate of the waveguide manifold. However, non-sequential arrangement is also feasible.

Channel filters are devices that are tuned to pass energy in a desired frequency range (i.e. the passband) and to reject energy at unwanted frequencies (i.e. the stopband). Channel filters are also designed to meet various performance criteria such as a particular level of insertion loss (IL), which is also known as rejection or isolation, and return loss (RL). The order of the channel filter is equivalent to the number of poles in the transfer function and the higher the order the more rejection a channel filter can provide. The number of poles can be seen by looking at a graph of the return loss wherein each peak represents one pole in the transfer function. For each pole there is a physical electrical cavity present in the channel filter. For example, a four-pole filter will have four electrical cavities and a five-pole filter will have five electrical cavities.

As conventionally known, a higher order filter provides greater rejection (i.e. insertion loss) than that of a lower order filter. Accordingly, the use of a high order filter allows for the bandwidth of the channel filter to be expanded since the extra pole(s) provide extra rejection. Overall this results in increased filter bandwidth. At the same time, reasonable filter rejection is maintained. For example, a five-pole filter provides a larger filter bandwidth than that of a four-pole filter because the fifth pole provides extra rejection that allows for the widening of the passband of each channel filter. While the overall filter rejection level associated with the five-pole filter will be reduced due to the widening of the passband, the filter rejection level will still be higher than that of a four-pole filter. In this way, the passband performance is significantly enhanced due to the wider bandwidth and a reasonable level of filter rejection is maintained.

As shown in FIG. 1A, the four electrical cavities of a four-pole filter will each result in a peak in the filter's return loss. As shown in FIG. 1B, the five electrical cavities of a five-pole filter will also each result in a peak in the filter's return loss. Finally, as shown in FIG. 1C, the five-pole filter will provide more insertion loss (5 POLE IL in FIG. 1C) (i.e. more rejection) than the four-pole filter (4 POLE IL in FIG. 1C).

Microwave multiplexing network filter performance is particularly important in satellite applications since an increase in the insertion loss of the channel filters in the microwave multiplexing network results in a reduction of Effective Isotropic Radiated Power (EIRP) emitted by the satellite and accordingly a reduction in the amount of radio frequency (RF) transmission power that is converted to thermal dissipation. Insertion loss also limits the transmission of spectral regrowth from the power amplifiers that drive the filters.

Conventional design techniques achieve increased filter rejection by increasing the order of the filter, for example from 4-poles to 5-poles. However, in order to do this, extra resonators are added to realize an additional pole. This approach typically increases the weight and size of the multiplexer which is a significant drawback for extremely weight sensitive satellite applications. Accordingly, prior art microwave filters and multiplexer design processes typically involve optimization of physical cavity structures for a particular channel such that the same filter order is maintained.

SUMMARY

The embodiments described herein provide in one aspect, a method for configuring a microwave multiplexing network including a first channel filter having a top end and a first coupling element, a second channel filter having a top end and a second coupling element, and an interconnect having a top surface and a bottom surface and a short circuit plate, in order to improve channel performance, said method comprising:

(a) defining a first interconnect spacing value as the distance between the short circuit plate and the center of the first coupling element and a second interconnect spacing value as the distance between the center of the first coupling element and the center of the second coupling element;

(b) defining a first filter to interconnect value as the distance between the center of the first coupling element and the closer of the top surface and the bottom surface of the interconnect and defining a second filter to interconnect value as the distance between the center of the second coupling element and the closer of the top surface and the bottom surface of the interconnect;

(c) determining the first and second interconnect spacing values and the first and second filter to interconnect values by:

for each of said first and second channel filters:

(i) selecting the first and second interconnect spacing values and the first and second filter to interconnect values to ensure that an additional real reflection zero is brought into the passband of the microwave multiplexing network and that the filter order is increased by one; and (d) coupling each of the top ends of the first and second channel filters to the closer of the top surface and the bottom surfaces of the interconnect according to the first and second interconnect spacing values and the first and second filter to interconnect values.

The embodiments described herein provide in another aspect, a microwave multiplexing network comprising:

(a) a first channel filter having a top end and a first coupling element and a second channel filter having a top end and a second coupling element;

(b) an interconnect having a top surface, a bottom surface, and a short circuit plate;

(c) said first channel filter being associated with a first interconnect spacing value that represents the distance between the short circuit plate and the center of the first coupling element and a first filter to interconnect value that represents the distance between the center of the first coupling element of the first filter and the closer of the top and bottom surfaces of the interconnect;

(d) said second channel filter being associated with a second interconnect spacing value that represents the distance between the center of the first coupling element and the center of the second coupling element, and a second filter to interconnect value that represents the distance between the center of the second coupling element and the closer of the top and bottom surfaces of the interconnect; and (e) each of said top ends of the first and second channel filters being coupled to the closer of the top and bottom surfaces of the interconnect according to the first and second interconnect spacing values and the first and second filter to interconnect values, wherein first and second interconnect spacing values and the first and second filter to interconnect values are determined for each of said first and second channel filters by:

(i) selecting the first and second interconnect spacing values and the first and second filter to interconnect values to ensure that an additional real reflection zero is brought into the passband of the microwave multiplexing network and wherein the filter order is increased by one.

Further aspects and advantages of the invention will appear from the following description taken together with the accompanying drawings.

BRIEF DESCRIPTION OF THE DRAWINGS

For a better understanding of the present invention, and to show more clearly how it may be carried into effect, reference will now be made, by way of example, to the accompanying drawings which show at least one exemplary embodiment, and in which.

Figure 1A:
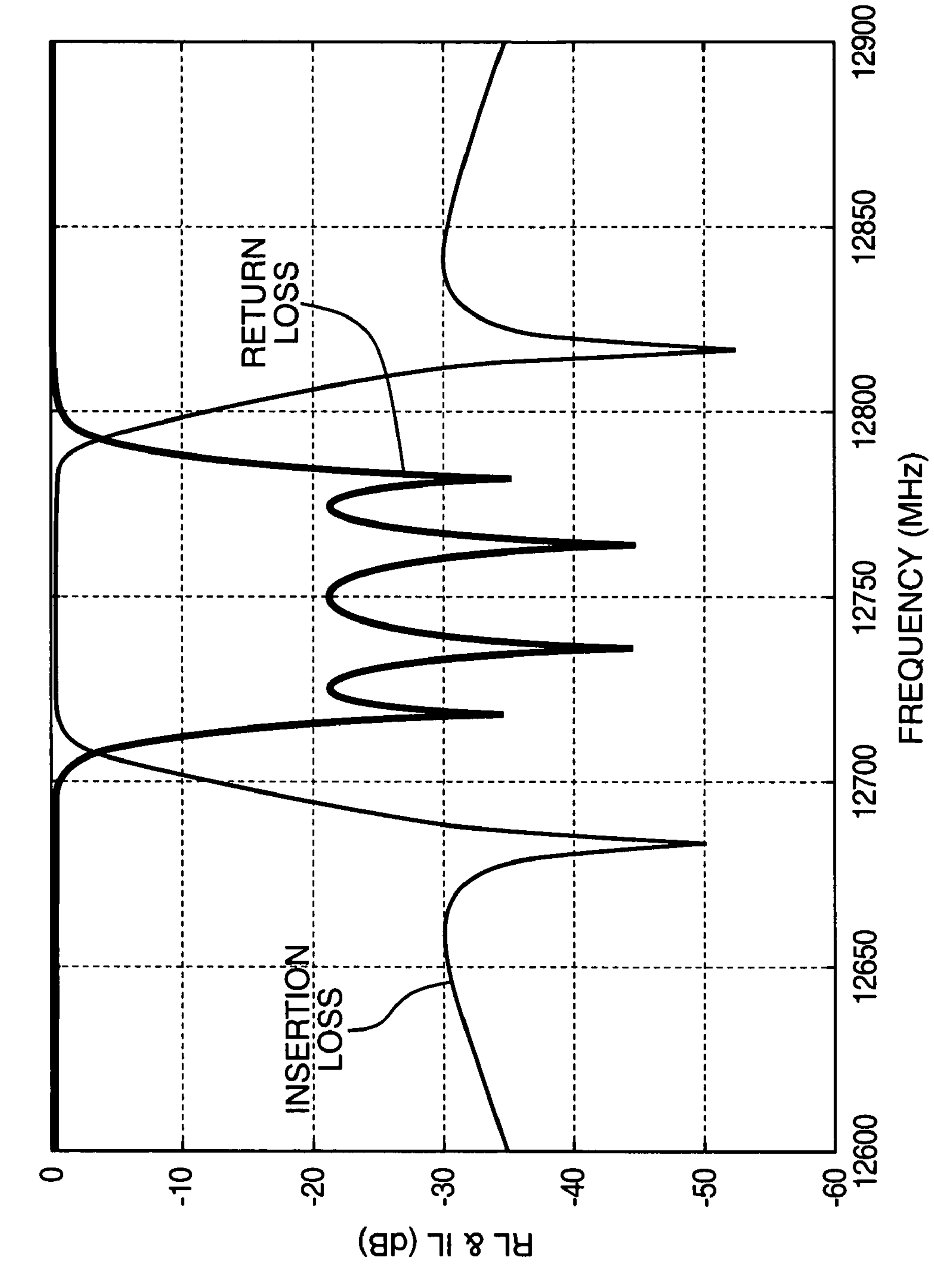
FIG. 1A PRIOR ART
FIG. 1A is a graph illustrating the return loss and insertion loss characteristics of a prior art four-pole filter.
Figure 1B:
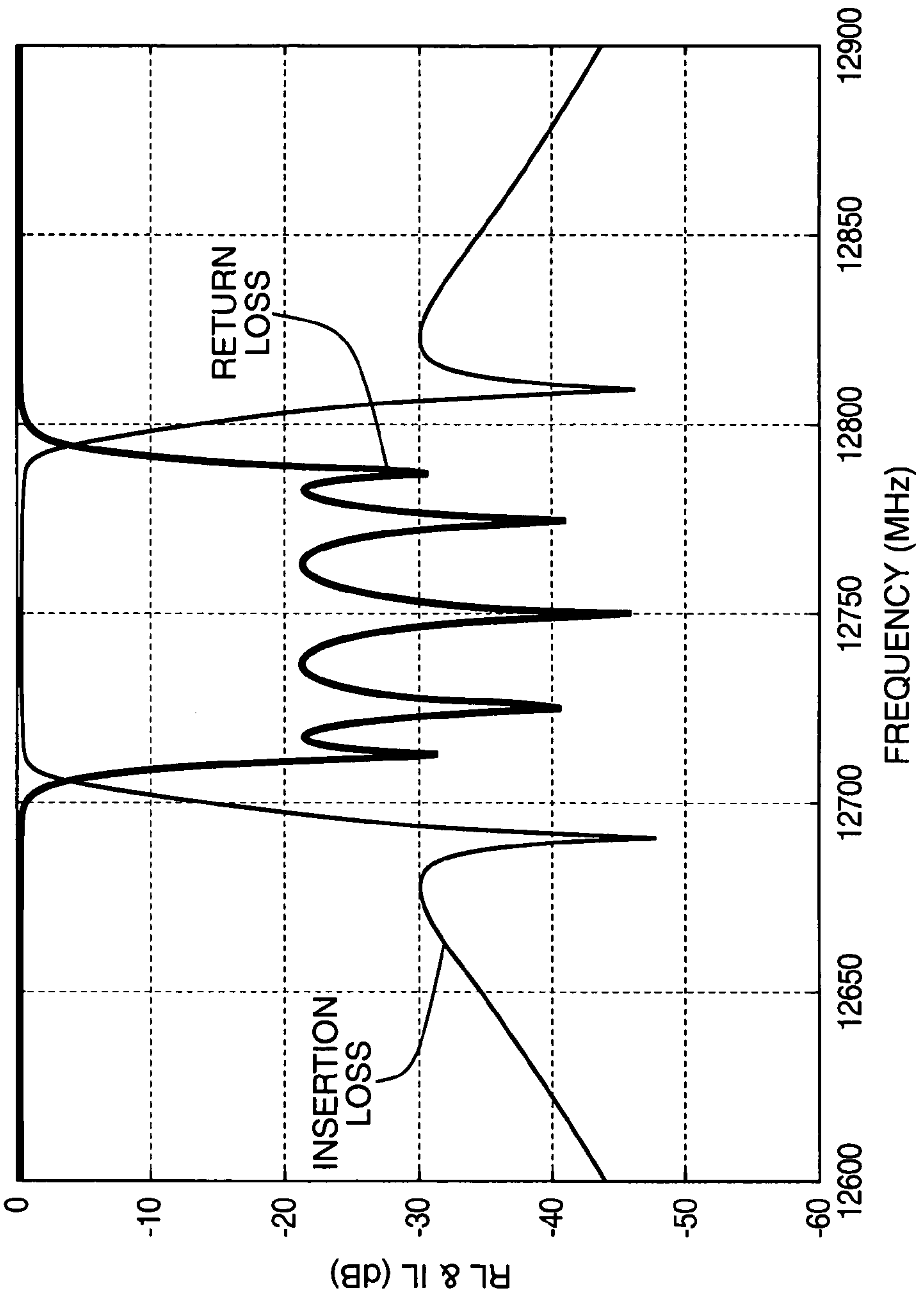
FIG. 1B PRIOR ART
FIG. 1B is a graph illustrating the return loss and insertion loss characteristics of a prior art five-pole filter.
Figure 1C:
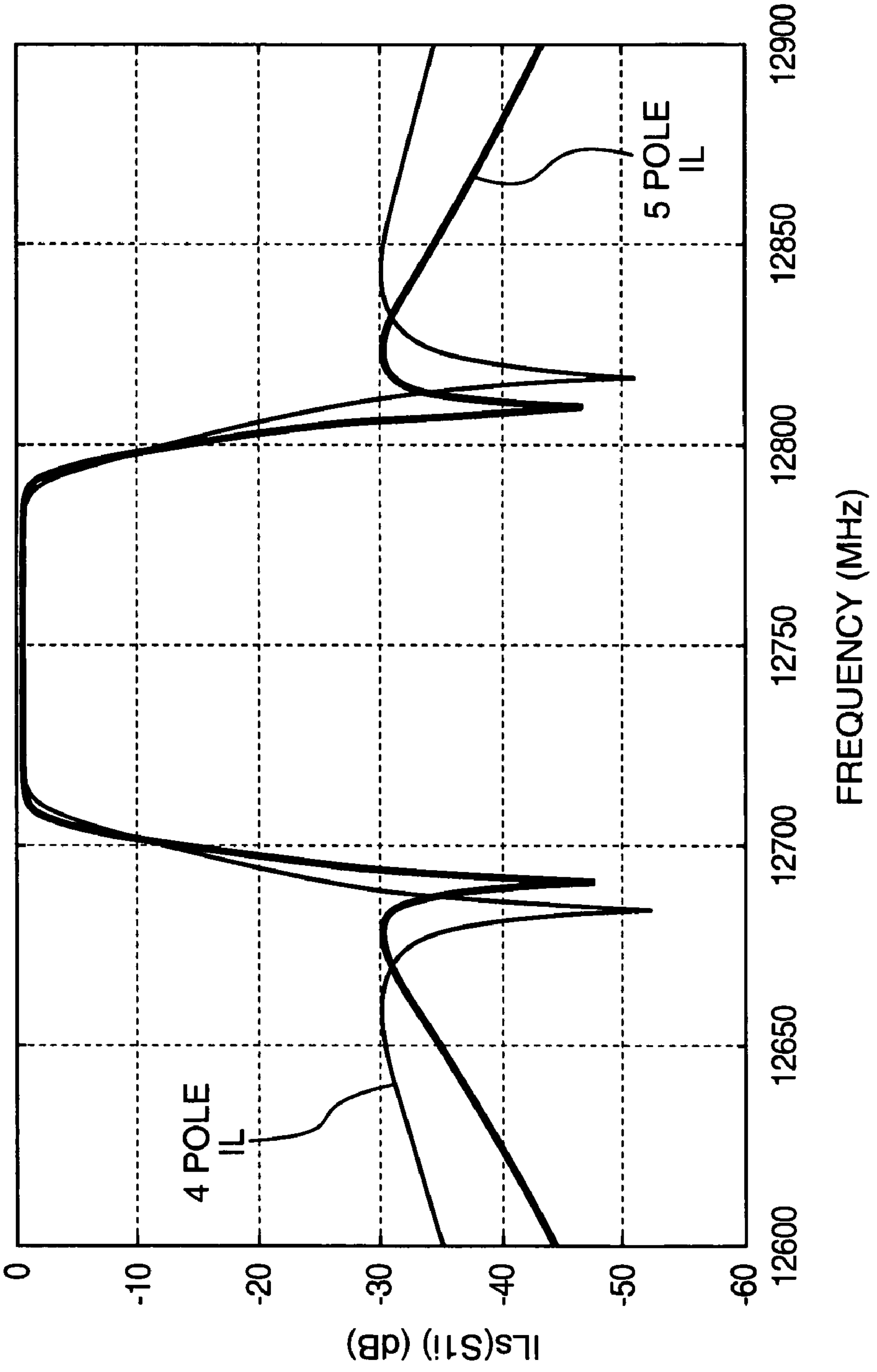
FIG. 1C PRIOR ART
FIG. 1C is a graph illustrating a comparison of insertion loss characteristics between the four-pole filter of FIG. 1A and the five-pole filter of FIG. 1B.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

It will be appreciated that for simplicity and clarity of illustration, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein, but rather as merely describing the implementation of the various embodiments described herein.

Figure 2:
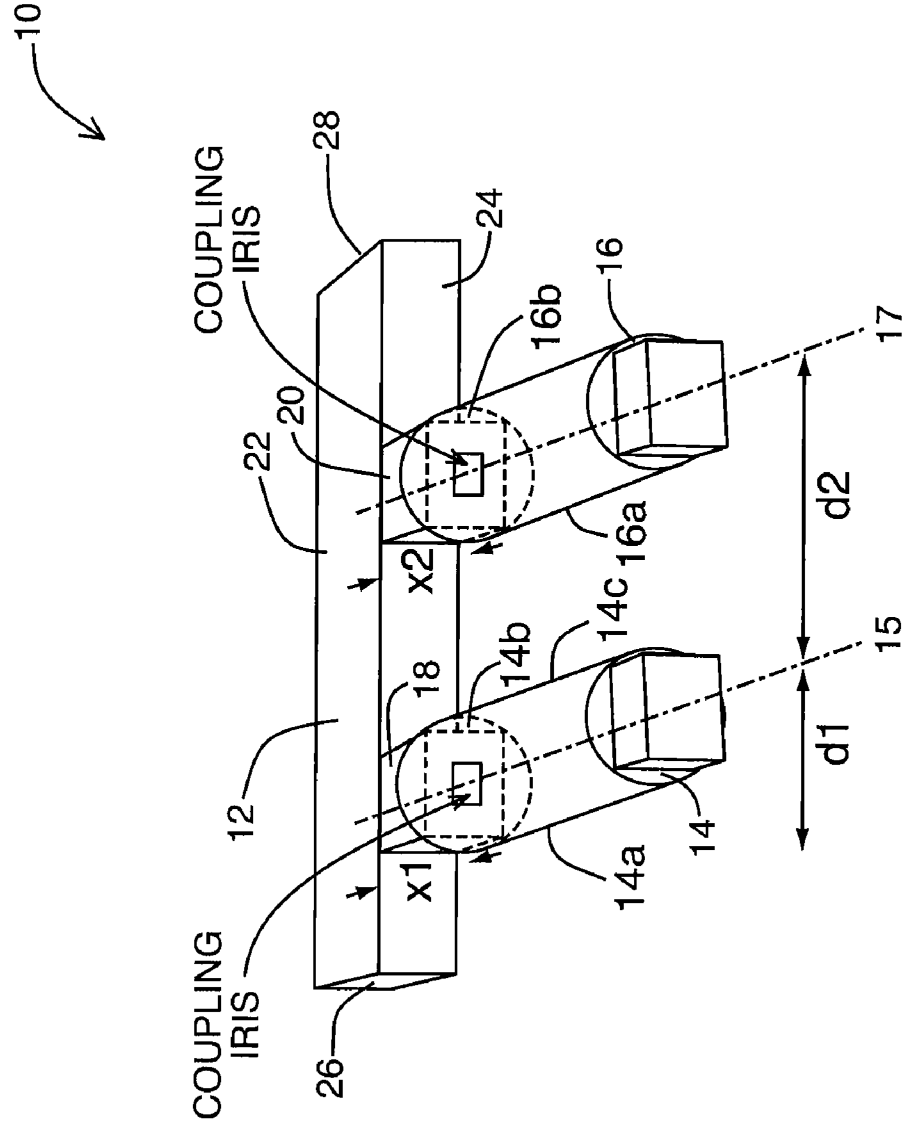
FIG. 2 is a schematic diagram of an exemplary embodiment of a microwave multiplexing network.

FIG. 2 is a block diagram that illustrates a microwave multiplexing network 10 in one exemplary embodiment. The microwave multiplexing network 10 includes an interconnect 12 (e.g. a microwave waveguide), a first channel filter 14, a second channel filter 16, a first waveguide T-junction 18 and a second waveguide T-junction 20. It should be understood that while the following describes the design of a dual-channel waveguide manifold coupled multiplexer, the design process and the microwave multiplexing network 10 itself are not limited to dual-channel waveguide manifold coupled multiplexers, but could encompass any microwave multiplexing network having any kind of interconnect and a plurality of channel filters.

The interconnect 12 has a top wall 22, a bottom wall 24, a short circuit plate 26 and an output end 28. The interconnect 12 in one example embodiment is a microwave waveguide 12. Those skilled in the art will appreciate that a waveguide is a device that controls the propagation of an electromagnetic wave so that the electromagnetic wave is forced to follow a particular path and typically takes the form of a hollow metal tube. The E-plane of the waveguide is defined as the plane with the largest side and the H-plane as the plane with the small side (E-plane and H-plane not shown in the figures). The width and height values of the rectangular manifold waveguide 12 are determined by the frequency of the multiplexer. Usually standard rectangular waveguide sizes are used. For example, the multiplexer having the characteristics shown in FIGS. 4A and 4B or more generally for any multiplexer working within 10.9 GHz to 12.7 GHz range, the manifold width is usually 0.75" and height is usually 0.375".

The first and second channel filters 14 and 16 are electromagnetic devices that can be tuned to pass energy that falls within a specific band (i.e. passband) and reject energy that falls outside of that band (i.e. stopband). The first and second channel filters 14 and 16 are coupled to the bottom surface 24 or the top surface 22 of the manifold waveguide 12 through the waveguide T-junctions 18 and 20. The first and second waveguide T-junctions 18 and 20 are conventional T-junctions. The channel filters 14 and 16 are preferably arranged on the manifold waveguide 12 according to centre frequencies such that the highest (or the lowest) frequency channel is adjacent to the shorting plane 26. However, such arrangement is not required. The filters 14 and 16 can be doubly terminated or signally terminated filters.

The first channel filter 14 has a first side wall 14*a* which is longitudinally spaced from the short circuit plate 26 of the manifold waveguide 12, a top wall 14*b*, having a first coupling element (e.g. iris) thereon (not shown), that is laterally spaced from the bottom wall 24 of the manifold waveguide 12, and a second side wall 14*c*. The second channel filter 16 has a first side wall 16*a* which is longitudinally spaced from the second side wall 14*c* of the first channel filter 14 and from the short circuit plate 26 of the manifold waveguide 12. The second channel filter 16 also has a top wall 16*b*, having a second coupling element (e.g. iris) thereon (not shown), that is laterally spaced from the bottom wall 24 of the manifold waveguide 12.

It should be understood that while this exemplary embodiment will be discussed in reference to coupling elements that are coupling irises that are formed within the top walls 14*b* and 16*b* of the first and second channel filters 14 and 16, respectively, any kind of coupling elements could be used to couple energy between the channel filters 14 and 16 and the manifold waveguide 12. That is, microwave multiplexing network 10 could use any coupling element that couples energy between filters and waveguides, such as wire probes.

In this particular example, the channel filters 14 and 16 are connected parallel to the E-plane of the manifold waveguide 12 to form an E-plane junction. However, the channel filters 14 and 16 could alternatively be connected parallel to the H-plane of the manifold waveguide 12 to form an H-plane junction. Normally the input waveguide orientation specifies which plane of a waveguide the filters will be attached to the manifold waveguide, however the enhancement process as described in FIG. 3 will be the same regardless of whether the filters are attached to the H-plane or the E-plane of the manifold waveguide 12. The E-plane connection is usually preferred for reasons of compactness since this kind of connection allows for a smaller channel to channel distance to be realized.

As shown in FIG. 2, the longitudinal distance d1 is defined by the distance from the short circuit plate 26 of the manifold waveguide 12 to the center 15 of the first coupling iris of the first channel filter 14. The longitudinal distance d2 is defined as the distance from the center 15 of the first coupling iris of the first channel filter 14 to the center 17 of the second coupling iris of the second channel filter 16. The lateral distance x1 is defined as the distance between the top wall 14*b* of the first channel filter 14 and the bottom surface 24 of the manifold waveguide 12. The lateral distance x2 is defined as the distance from the top wall 16*b* to the bottom surface 24 of the manifold waveguide 12.

The following discussion assumes that the first and second channel filters are both coupled to the bottom surface 24 of the manifold waveguide 12. However, it should be understood that the channel filters could each be attached to either the top 22 or the bottom 24 surfaces of the manifold waveguide 12. In the case when the first channel filter is coupled to the top surface 22 of the manifold waveguide 12 (not shown), the lateral distance x1 is defined as the distance between the top wall 14*b* of the first channel filter 14 and the top surface 22 of the manifold waveguide 12. In the case when the second channel filter is coupled to the top surface 22 of the manifold waveguide 12 (not shown), the lateral distance x2 is defined as the distance from the top wall 16*b* to the top surface 22 of the manifold waveguide 12.

Also, it should be understood that the short circuit plate 26 discussed above (FIG. 2) could be replaced with another channel filter, which would be equivalent to making the first interconnect spacing zero.

Figure 3:
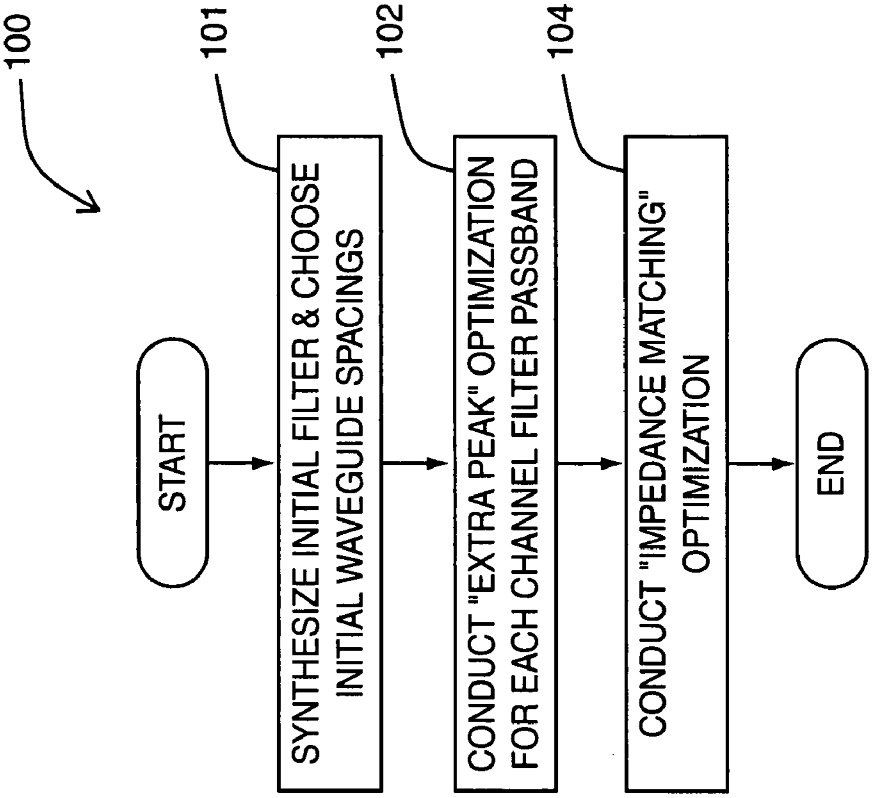
FIG. 3 is a flowchart of an exemplary embodiment of a method to optimize the design of the microwave multiplexing network of FIG. 2.

FIG. 3 is a flowchart illustrating an example embodiment of a design process 100 for selecting values for the d1, d2, x1 and x2 dimensions for the dual-channel waveguide manifold coupled multiplexer 10 of FIG. 2 such that the overall performance (i.e. bandwidth and filter rejection) of the microwave multiplexing network 10 is enhanced without the addition of any hardware elements.

At step (101), the filters 14 and 16 are initially synthesized to approximately meet insertion loss requirements and initial values of waveguide spacings are chosen to correspond to the half-guided wavelength evaluated at the center frequency of the corresponding channel filter.

At step (102), the manifold waveguide 12 is considered to be an extra resonator (i.e. electrical cavity) that creates its own real reflection zero within the passband of each of the first and second channel filters 14 and 16. This approach is implemented by executing process steps that determine the values of the d1, d2, x1 and x2 dimensions that will produce an extra peak in the passband of each of first and second channel filter 14 and 16. The extra peak essentially increases the filter order of the first and second channel filters by one, which in turn results in improved passband flatness and out of band rejection without adding extra hardware.

At step (104), optimization process steps are executed iteratively so that the values for the d1, d2, x1 and x2 dimensions and the internal dimensions of the first and second channel filters 14 and 16 are selected to ensure good impedance matching into the manifold waveguide 12. The objective of step (104) is to achieve a return loss with all the passband peaks falling below a certain level, such as −22 dB. Additional details regarding of this step can be found in U.S. Pat. No. 4,258,435.

One of the advantages of the enhancement process 100 is that the bandwidth of each channel filter can be expanded because the extra pole created by the enhancement process provides extra rejection. The additional pole does not actually increase or widen the passband region, but the insertion loss is increased out of band that means that more of the passband can be used without possible interference from one of the other filters. Typically, when a filter's bandwidth is increased, the out of band rejection decreases. Therefore, there is a trade-off between bandwidth and out of band rejection. Since the enhancement process 100 provides extra rejection due to the extra passband pole, the filter bandwidth can be expanded while still obtaining better out of band rejection than that which could be obtained by a conventional filter.

Design Comparison

To illustrate the effectiveness of the design process 100, a comparison of conventional design techniques with the design process 100 has been conducted. For this example comparison, the working frequency was taken to be within 10.9 GHz-12.7 GHz.

First, a well-known conventional microwave multiplexing network design process was applied to an exemplary set of first and second channel filters 14, 16 and manifold waveguide 12 components. Specifically, the well-known conventional design approach used is disclosed in "Computer-Aided Design of Waveguide Multiplexers", A. E. Atia, IEEE Transactions on Microwave Theory and Techniques, vol. MTT-22, pp. 332-336, March 1974 and "Exact Simulation and Sensitivity Analysis of Multiplexing Networks", J. W. Bandler, S. Daijavad, and Q. J. Zhang, IEEE Transactions on Microwave Theory and Techniques, vol. MTT-34, pp. 93-102, January 1986.

In the conventional approach, individual filters are synthesized as a first step to approximately meet insertion loss requirements. The starting values of waveguide spacings are then selected to be the half-guided wavelength evaluated at the center frequency of the corresponding channel filter. Then waveguide spacings and each channel filter are optimized to achieve a common port return loss below a certain level (e.g. −22 dB). When the conventional design process is applied, the following values for the d1, d2, x1 and x2 dimensions result, as set out in Table 1 below, wherein F/F spacing stands for manifold spacing and F/M spacing stands for filter to manifold spacing.

TABLE 1

| Channel Filter | F/F Spacing | F/M Spacing |
|---|---|---|
| First channel filter 14 | 0.53047 (d1) | 0.70035 (x1) |
| Second channel filter 16 | 2.35389 (d2) | 0.68411 (x2) |

Second, the design process 100 discussed above is applied to the exemplary first and second channel filter 14, 16 and manifold waveguide 12 components. The values that result from the execution of steps (102) and (104) of the design process 100 are provided in Table 2 shown below.

TABLE 2

| Channel Filter | F/F Spacing | F/M Spacing |
|---|---|---|
| First channel filter 14 | 0.36175 (d1) | 0.79802 (x1) |
| Second channel filter 16 | 2.48418 (d2) | 0.76076 (x2) |

Figure 4A:
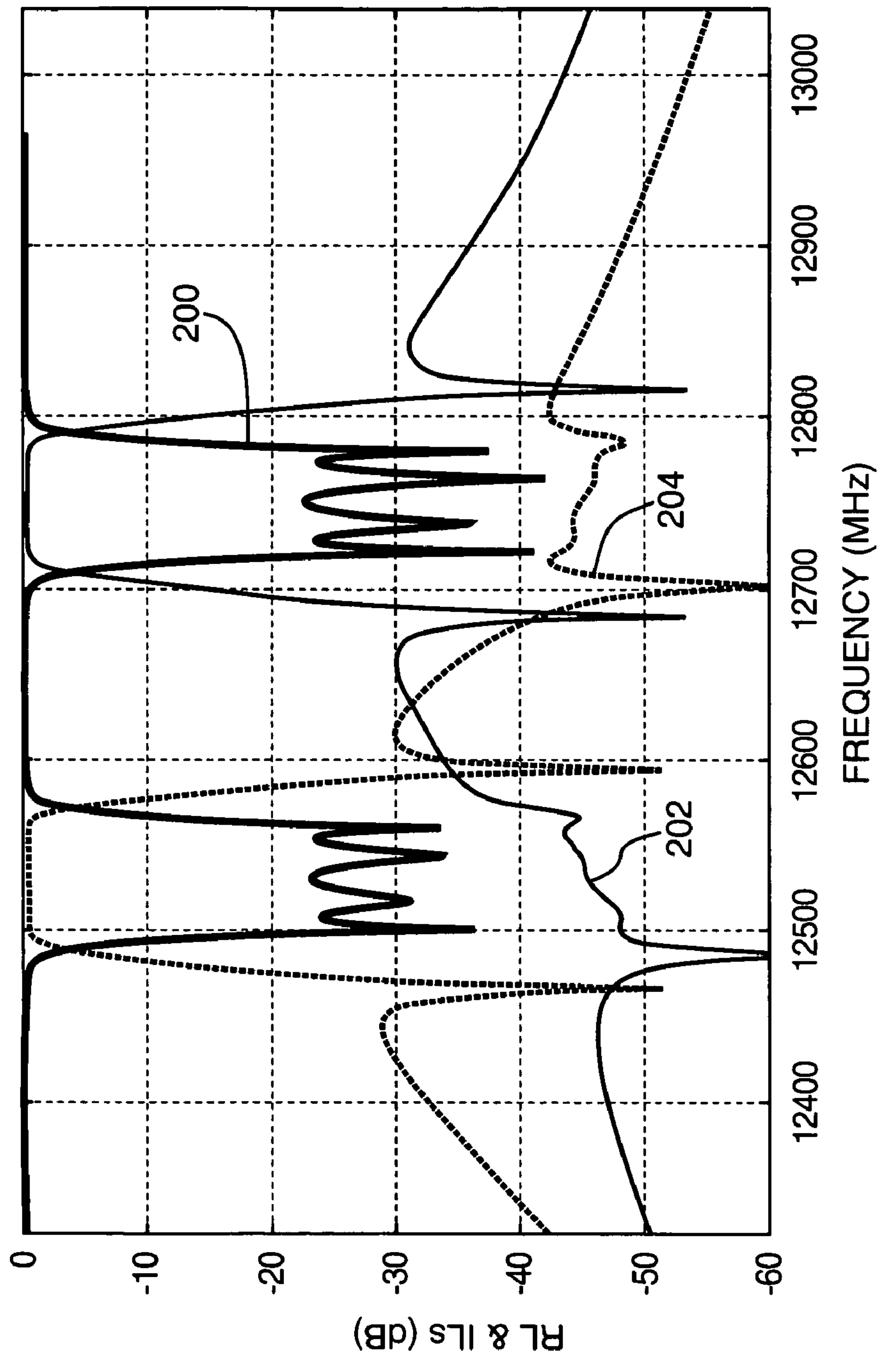
FIG. 4A is a graph showing the response, in S-parameters, of a dual-channel waveguide manifold coupled multiplexer designed in accordance with a conventional design method.

FIG. 4A is a graph that illustrates the response, using scattering parameters, of a dual-channel waveguide manifold coupled multiplexer designed in accordance with the conventional design process discussed above.

Those skilled in the art will appreciate that scattering parameters, or S-parameters as they are commonly referred to, form a scattering matrix that describes the response of an n-port network to voltage signals at each port. Each S-parameter, $S_{xy}$, represents the ratio of an output port to an input port and the subscripts, x and y, denote the output and input port numbers respectively. For example, $S_{12}$ is the ratio of the output port 1 to the input port 2. Where the input and output ports differ (e.g. $S_{12}$) the S-parameter represents the transmission coefficient between those two ports. Where the input and output ports are the same (e.g. $S_{11}$) the S-parameter represents the reflection coefficient of that port.

The graph in FIG. 4A consists of three curves 200, 202 and 204, namely the $S_{11}$ curve 200, the $S_{12}$ curve 202, and the $S_{13}$ curve 204. For the purposes of this example the waveguide output port has been designated port 1, the first channel filter input port has been designated port 2 and the second channel input port has been designated port 3.

FIG. 4A shows three scattering parameter curves. The $S_{11}$ curve 200 is a ratio of the power of the output wave at port 1 to the power of the input wave at port 1 in decibels (dB) as a function of frequency. The $S_{11}$ curve 200 therefore represents the return loss of the waveguide output port. Those skilled in the art will appreciate that return loss is the ratio in dB of the reflected power of a device to the incident power upon the device. The $S_{12}$ curve 202 is a ratio of the power of the output wave at port 1 to the power of the input wave at port 2 in dB as a function of frequency. Thus $S_{12}$ curve 202 represents the insertion loss of the first channel filter. Those skilled in the art will appreciate that insertion loss is the attenuation through a filter. The $S_{13}$ curve 204 is the ratio of the power of the output wave at port 1 to the power of the input wave at port 3 in dB as a function of frequency. The $S_{13}$ curve 204 thus represents the insertion loss of the second channel filter.

Figure 4B:
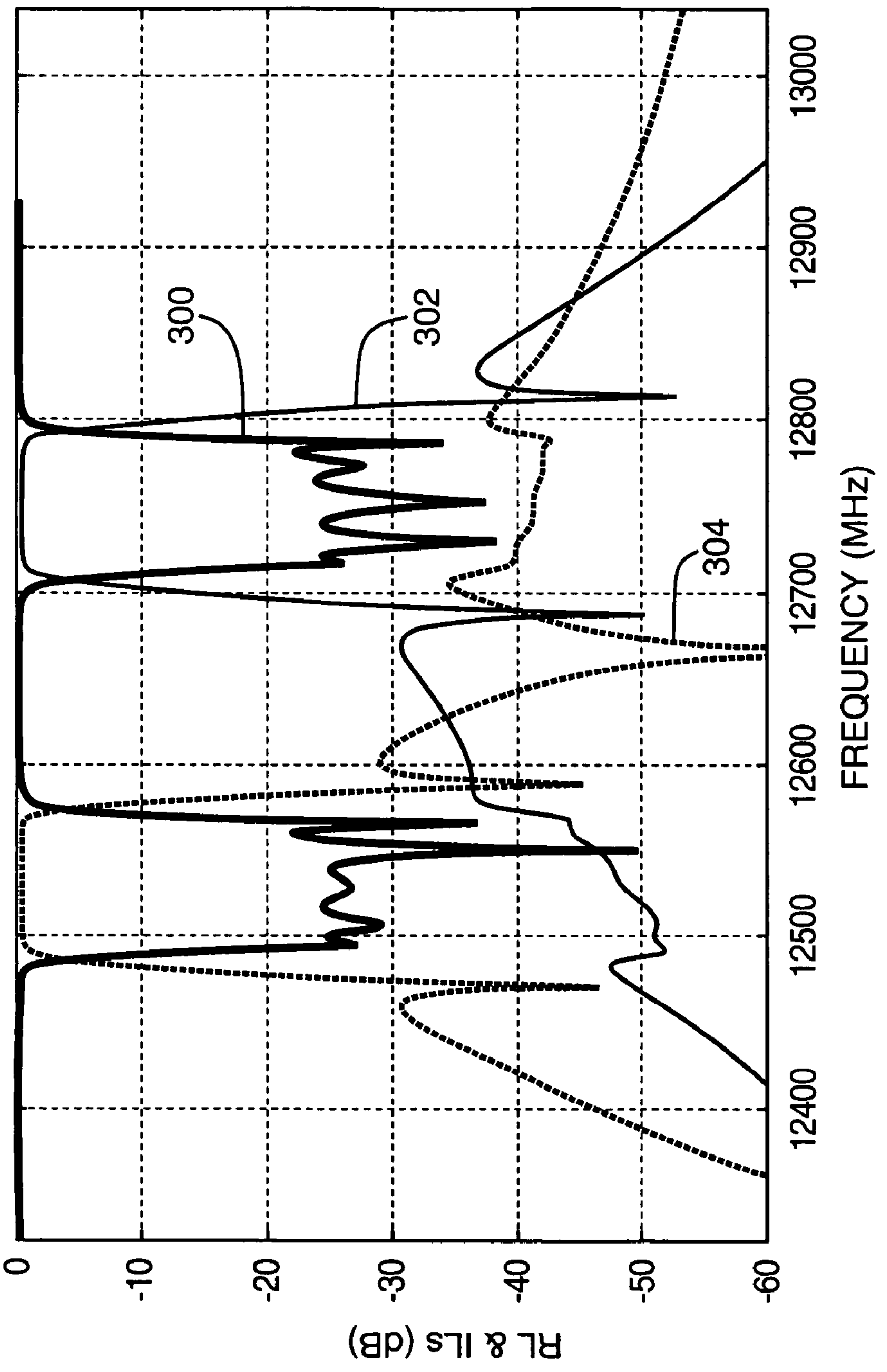
FIG. 4B is a graph showing the response, in S-parameters, of a dual-channel waveguide manifold coupled multiplexer designed in accordance with the method illustrated in FIG. 3.

FIG. 4B is a graph that illustrates the response, using scattering parameters, of a dual-channel waveguide manifold coupled multiplexer, this time designed in accordance with the design process 100 discussed above. Specifically, FIG. 4B is a graph showing three curves 300, 302 and 304, namely the $S_{11}$ curve 300, the $S_{12}$ curve 302, and the $S_{13}$ curve 304 that results.

To clearly evidence the improvements of the design process 100 over the conventional design process, the S-parameters of a dual-channel multiplexer designed in accordance with conventional design process and shown in FIG. 4A will be compared with the S-parameters of a dual-channel multiplexer designed using the design process 100 and shown in FIG. 4B.

Comparing the $S_{11}$ curve of FIG. 4A to the $S_{11}$ curve of FIG. 4B it can be seen that the $S_{11}$ curve of FIG. 4B is essentially a combination of two five-pole filters whereas the $S_{11}$ curve of FIG. 4A is essentially a combination of two four-pole filters.

Figure 5:
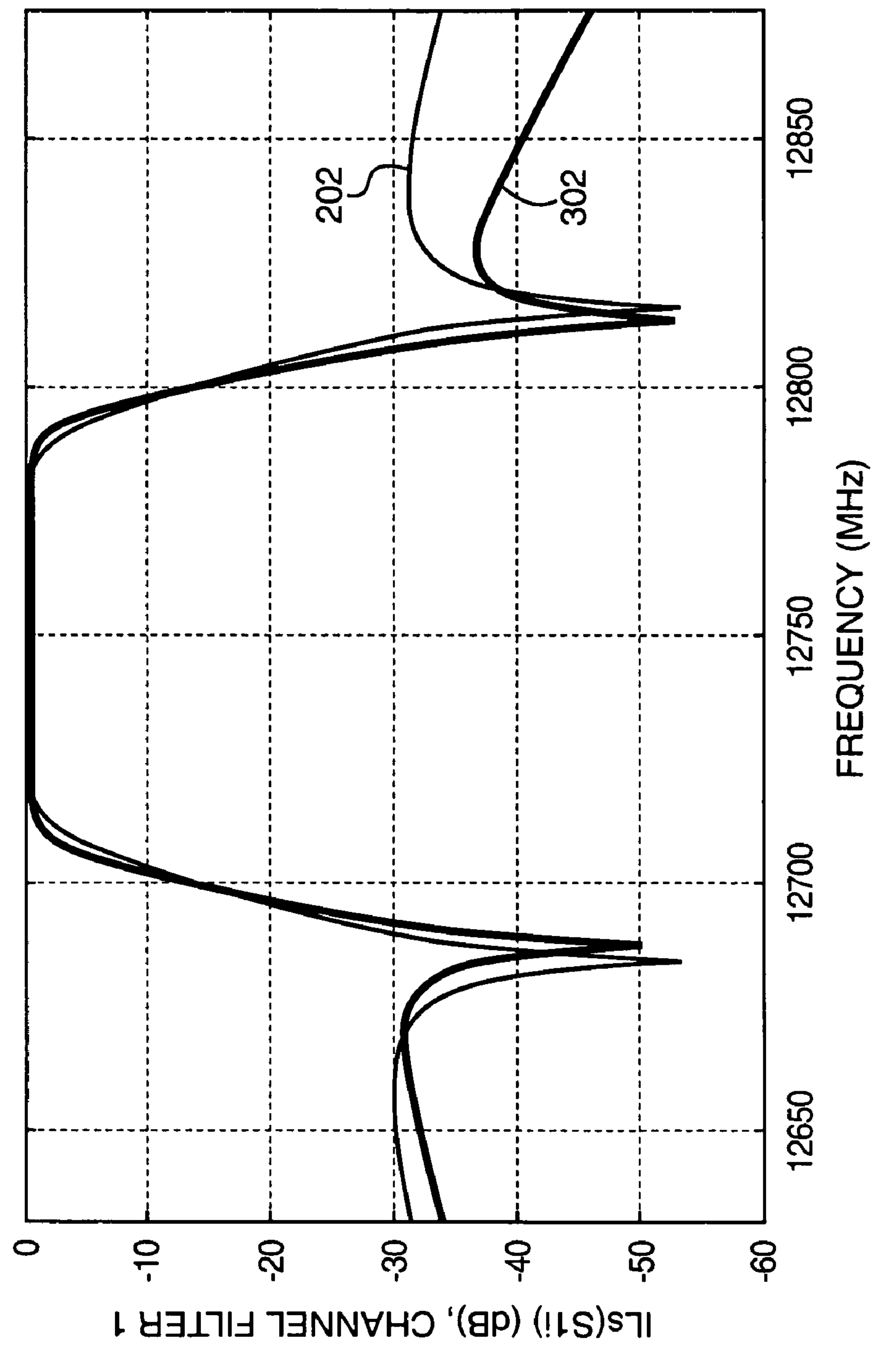
FIG. 5 is a graph illustrating a comparison of the first channel filter response of FIG. 4A to that of FIG. 4B.

To best see the improvement in the performance of the first channel filter the $S_{12}$ parameters of FIG. 4A and FIG. 4B have been isolated and are comparatively shown in FIG. 5. In comparing the two curves in FIG. 5 it is obvious that the $S_{12}$ curve 302 is flat over a wider frequency range than the $S_{12}$ curve 202, thus the channel filter represented by the $S_{12}$ curve 302 has a greater bandwidth than the channel filter represented by the $S_{12}$ curve 202. It also can be seen that this increased bandwidth is not achieved at the expense of rejection in the out of band region as it can be seen that the $S_{12}$ curve 302 has a much steeper rejection rate than the $S_{12}$ curve 202.

Figure 6:
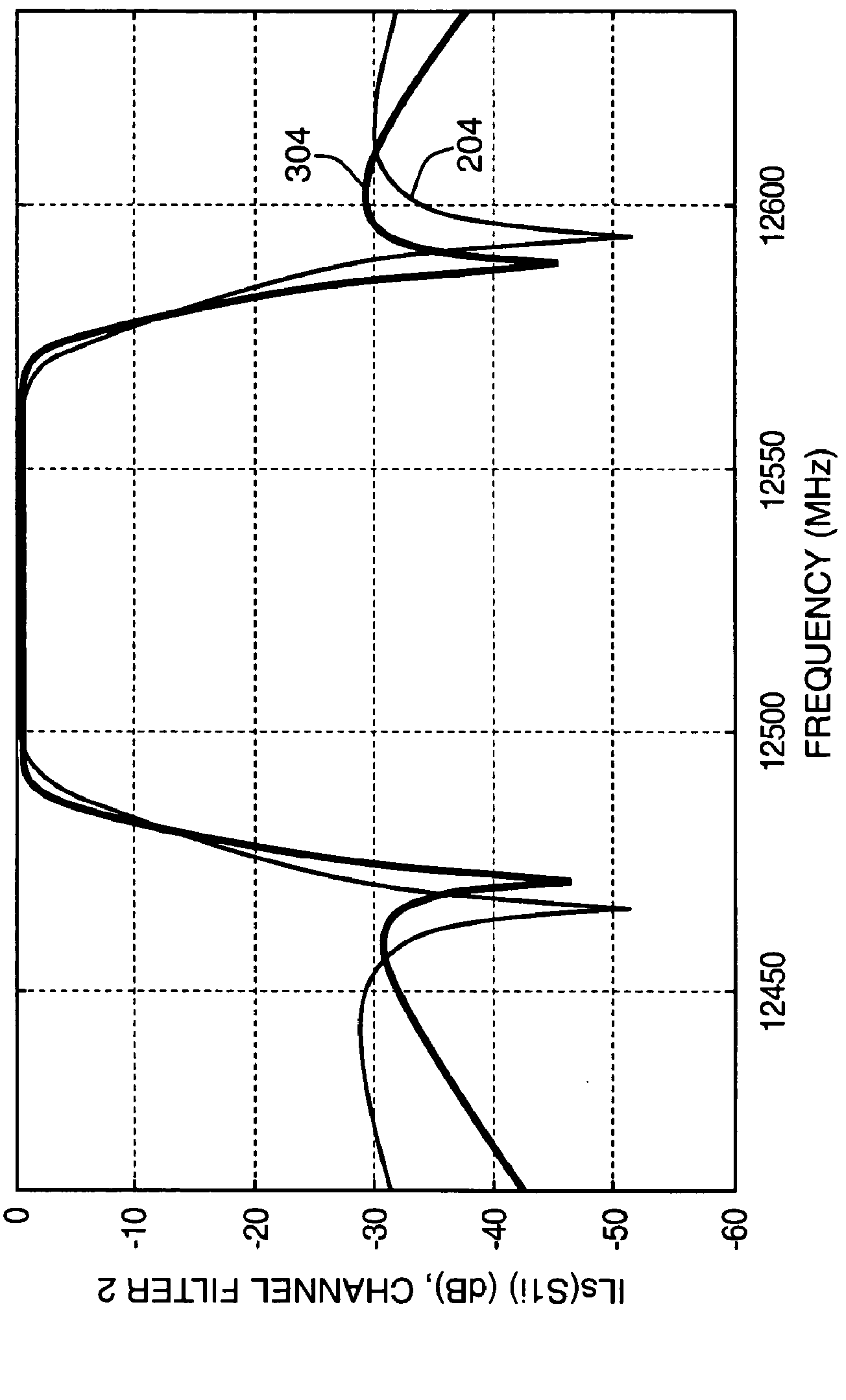
FIG. 6 is a graph illustrating a comparison of the second channel filter response of FIG. 4A to that of FIG. 4B.

Similarly, to best see the improvement in the performance of the second channel filter 16 the $S_{13}$ parameters of FIG. 4A and FIG. 4B have been isolated and are comparatively shown in FIG. 6. In comparing the two curves in FIG. 6 we can see similar results as were seen in FIG. 5. That is, the $S_{13}$ curve 304 exhibits wider bandwidth and increased rejection in the out of band region in comparison with those parameters of the $S_{13}$ curve 204.

However, it should be noted that the two channel filters 14 and 16 did not experience the same level of improvement. This is a common result for the design process 100. Generally, while the overall multiplexer response is improved through use of the design process 100 as noted above, not all channel filters will realize the same performance enhancement. Though generally extra poles (or peaks) can be added into over all multiplexer response for every channel without adding extra cavities, exceptions do exist including not all channel will see the same enhancement, i.e. not all channel filters will have extra poles in their response characteristic. The causes can be the overall size constraint, the number of channels, center frequency of each channel and/or bandwidth of each channel. However, in all cases, at least two channel filters will have response characteristics that include additional poles.

It also should be noted that while it has been shown that the design process 100 can be used to increase the filter order without adding additional hardware, those skilled in the art will appreciate that the design process 100 can be used to achieve the same level of performance with less hardware. For example, traditionally a triple mode filter is achieved through the use of a triple mode cavity, with the design process 100 however, a triple mode filter can be achieved with one less electrical cavity.

While certain features of the invention have been illustrated and described herein, many modifications, substitutions, changes, and equivalents will now occur to those of ordinary skill in the art. For example, the short circuit plate 26 discussed above (FIG. 2) could be replaced with another channel filter, which would be equivalent to making the first interconnect spacing zero. It is, therefore, to be understood that the appended claims are intended to cover all such modifications and changes as fall within the true spirit of the invention.

The invention claimed is:

1. A microwave multiplexing network comprising:

(a) a first channel filter having a top end and a first coupling element and a second channel filter having a top end and a second coupling element;

(b) an interconnect having a top surface, a bottom surface, and a short circuit plate;

(c) said first channel filter being associated with a first interconnect spacing value that represents the distance between the short circuit plate and the center of the first coupling element and a first filter to interconnect value that represents the distance between the center of the first coupling element of the first filter and the closer of the top and bottom surfaces of the interconnect;

(d) said second channel filter being associated with a second interconnect spacing value that represents the distance between the center of the first coupling element and the center of the second coupling element, and a second filter to interconnect value that represents the distance between the center of the second coupling element and the closer of the top and bottom surfaces of the interconnect; and (e) each of said top ends of the first and second channel filters being coupled to the closer of the top and bottom surfaces of the interconnect according to the first and second interconnect spacing values and the first and second filter to interconnect values, wherein first and second interconnect spacing values and the first and second filter to interconnect values are determined for each of said first and second channel filters by:

(i) selecting the first and second interconnect spacing values and the first and second filter to interconnect values to ensure that an additional real reflection zero is brought into the passband of the microwave multiplexing network and wherein the filter order is increased by one.

2. The multiplexing network of claim 1, wherein (e) further includes:

(ii) selecting the first and second interconnect spacing values and the first and second filter to interconnect values to ensure that the return loss of the multiplexing network is less than a predetermined return loss level.

3. The multiplexing network of claim 2, wherein (ii) further includes selecting the internal dimensions of the first and second filters to ensure that the return loss is less than a predetermined return loss level.

4. The multiplexing network of claim 2, wherein the interconnect is a manifold waveguide.

5. A method for configuring a microwave multiplexing network including a first channel filter having a top end and a first coupling element, a second channel filter having a top end and a second coupling element, and an interconnect having a top surface and a bottom surface and a short circuit plate, in order to improve channel performance, said method comprising:

(a) defining a first interconnect spacing value as the distance between the short circuit plate and the center of the first coupling element and a second interconnect spacing value as the distance between the center of the first coupling element and the center of the second coupling element;

(b) defining a first filter to interconnect value as the distance between the center of the first coupling element and the closer of the top surface and the bottom surface of the interconnect and defining a second filter to interconnect value as the distance between the center of the second coupling element and the closer of the top surface and the bottom surface of the interconnect;

(c) determining the first and second interconnect spacing values and the first and second filter to interconnect values by:

for each of said first and second channel filters:

(i) selecting the first and second interconnect spacing values and the first and second filter to interconnect values to ensure that an additional real reflection zero is brought into the passband of the microwave multiplexing network and that the filter order is increased by one; and (d) coupling each of the top ends of the first and second channel filters to the closer of the top surface and the bottom surfaces of the interconnect according to the first and second interconnect spacing values and the first and second filter to interconnect values.

6. The method of claim 5, wherein (c) further includes:

(ii) selecting the first and second interconnect spacing values, and the first and second filter to interconnect values to ensure that the return loss of the microwave multiplexing network is less than a predetermined return loss level.

7. The method of claim 6, wherein (ii) further includes adjusting the internal dimensions of the first and second channel filters to ensure that the return loss is less than a predetermined return loss level.

8. The method of claim 7, wherein the interconnect is a manifold waveguide.

* * * * *